US012757761B2

(12) United States Patent
Liu et al.

(10) Patent No.: US 12,757,761 B2
(45) Date of Patent: Oct. 6, 2026

(54) TSV-TYPE EMBEDDED MULTI-DIE INTERCONNECT BRIDGE ENABLING WITH THERMAL COMPRESSION NON-CONDUCTIVE FILM (TC-NCF) PROCESS

(71) Applicant: Intel Corporation, Santa Clara, CA (US)

(72) Inventors: Minglu Liu, Chandler, AZ (US); Gang Duan, Chandler, AZ (US); Liang He, Chandler, AZ (US); Ziyin Lin, Chandler, AZ (US); Elizabeth Nofen, Phoenix, AZ (US); Yiqun Bai, Chandler, AZ (US); Jonathan Atkins, Phoenix, AZ (US); Jesus S. Nieto Pescador, Chandler, AZ (US); Srinivas V. Pietambaram, Chandler, AZ (US); Kristof Darmawikarta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 18/089,483

(22) Filed: Dec. 27, 2022

(65) Prior Publication Data

US 2024/0213164 A1 Jun. 27, 2024

(51) Int. Cl.

| | |
|---|---|
| ***H10W 70/692*** | (2026.01) |
| ***H10W 20/41*** | (2026.01) |
| ***H10W 20/42*** | (2026.01) |
| ***H10W 70/65*** | (2026.01) |
| ***H10W 72/20*** | (2026.01) |
| *H10W 72/00* | (2026.01) |

(52) U.S. Cl.

CPC ........... *H10W 70/65* (2026.01); *H10W 20/42* (2026.01); *H10W 20/435* (2026.01); *H10W 72/20* (2026.01); *H10W 72/07254* (2026.01); *H10W 72/244* (2026.01)

(58) Field of Classification Search

CPC ............ H10W 70/692; H10W 70/611; H10W 70/635

See application file for complete search history.

(56) References Cited

U.S. PATENT DOCUMENTS

2018/0366436 A1* 12/2018 Wang .................. H01L 25/0652
2021/0272881 A1* 9/2021 Vaidya ................ H01L 25/0655

* cited by examiner

*Primary Examiner* — Errol V Fernandes
(74) *Attorney, Agent, or Firm* — Schwabe, Williamson & Wyatt P.C.

(57) ABSTRACT

Embodiments disclosed herein include an electronic package. In an embodiment, the electronic package comprises a package substrate, and an opening in the package substrate. In an embodiment, a plurality of first pads are provided at a bottom of the opening, and a bridge die is in the opening. In an embodiment, the bridge die comprises a plurality of second pads that are coupled to the first pads by solder. In an embodiment, a non-conductive film (NCF) is around the solder between the first pads and the second pads.

20 Claims, 9 Drawing Sheets

TSV-TYPE EMBEDDED MULTI-DIE INTERCONNECT BRIDGE ENABLING WITH THERMAL COMPRESSION NON-CONDUCTIVE FILM (TC-NCF) PROCESS

TECHNICAL FIELD

Embodiments of the present disclosure relate to electronic packages, and more particularly to package substrates with TSV embedded multi-die interconnect bridges (EMIB) that are mounted to the package substrate using a thermal compression non-conductive film (TC-NCF).

BACKGROUND

Advanced packaging architectures have moved towards the use of disaggregated dies. The smaller dies (sometimes referred to as chiplets or tiles) are communicatively coupled to each other through the package substrate. Particularly, in some instances a bridge die, such as an embedded multi-die interconnect bridge (EMIB), can be used to communicatively couple a pair of dies together. In some instances the bridge die is an entirely passive component. That is, only electrical routing between the two overlying chiplets is provided on the bridge die. However, in some instances, the bridge die may include active circuitry.

In yet another instance, the bridge die may include through silicon vias (TSVs) that allow for power to be transferred from the backside of the bridge die to the front side of the bridge die. In such architectures, the backside of the bridge die needs to be electrically coupled to the package substrate. In some instances a thermocompression bonding (TCB) approach is used to bond backside pads of the bridge die to pads at the bottom of a cavity in the package substrate. However, such solutions require flux dispensing, TCB bonding, defluxing, epoxy dispense, and epoxy curing. The architecture of the cavity (which has a width just slightly larger than a width of the bridge die) makes these operations difficult to implement.

EMBODIMENTS OF THE PRESENT DISCLOSURE

Described herein are package substrates with embedded multi-die interconnect bridges (EMIB) that are mounted to the package substrate using a thermal compression non-conductive film (TC-NCF), in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

In traditional bridge architectures, there is no electrical routing on the backside of the bridge. In such cases the bridge can be easily placed into a cavity in the package substrate. Sometimes an adhesive is used in order to secure the bridge to the package substrate. However, advanced embedded bridge designs have begun to incorporate backside pads and through silicon vias (TSVs) in order to provide power through a thickness of the embedded bridge. With the inclusion of backside electrical features, the coupling of the bridge to the package substrate becomes more complex. Particularly, solder connections and underfill solutions may need to be included in the design, and flux is typically needed for oxide removal and forming healthy joints. The flux then needs to be removed after thermocompression bonding (TCB) and an epoxy needs to be dispensed around the solder. These processes prove difficult to enable, and have led to poor yields on bridging die embedding inside cavities and longer assembly times. Furthermore, as the number of bridges within an electronic package continues to increase, the throughput and yield continue to decrease.

More generally, the existing process flow for assembling bridge dies to a package substrate is described in the process

Figure 1:
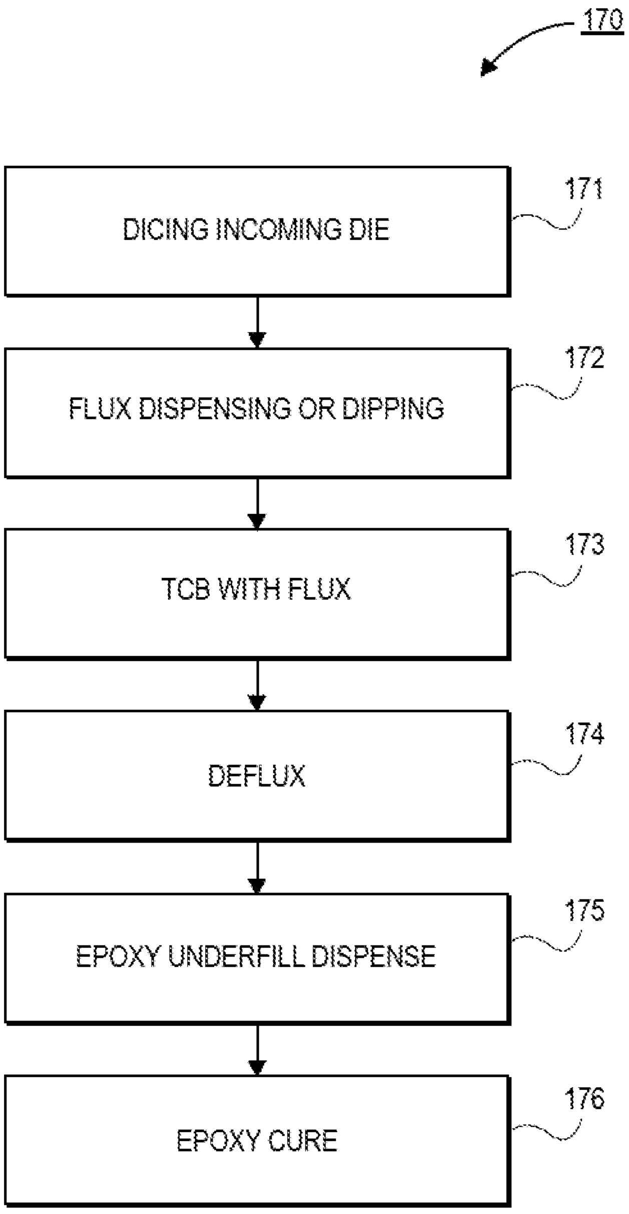
FIG. 1 is a process flow diagram of a process for thermocompression bonding (TCB) a bridge to a package substrate.

170 shown in FIG. 1. As illustrated, the process begins with dicing the incoming wafer into a plurality of dies at operation 171. Then, at operation 172, a flux dispensing or flux dipping process is used to surround the solder or bumps on the backside surface of the dies. Thereafter, at operation 173, a TCB process that utilizes the flux is implemented. The TCB process may be used to bond the die to the package substrate. Typically, this includes melting the solder and compression bonding the backside pads of the die to pads on the package substrate. After the TCB process, the flux is removed in a defluxing operation 174. The defluxing operation 174 is not a simple removal of the material. Particularly, since the width of the die is nearly the same width as the cavity the die sits in, it is difficult to remove the flux material.

When the flux can be removed, the process continues with operation 175 which includes an epoxy underfill dispensing process. The narrow gap between the die edge and the sidewall of the cavity also make this material dispense operation difficult. As such, epoxy on die, epoxy on substrates and incomplete underfilling is possible and can lead to reliability concerns in the electronic package. After the underfill dispense, the epoxy is cured, as shown in operation 176.

Accordingly, embodiments disclosed herein include the use of a non-conductive film (NCF) that is provided around the solder or bumps between the bridge die and the package substrate. The NCF can be applied to the bridge die at a wafer level process before die singulation. The NCF protects the interface and can be used instead of a fluxing agent in order to prevent oxidation. Additionally, the NCF has properties similar to those of epoxy underfill. As such, the NCF can be cured, and there is no need for a separate epoxy underfill and curing process. These advantages allow for the assembly process to bypass material removal (e.g., flux) and material dispense (e.g., epoxy underfill). This is particularly beneficial when the width of the cavity in the package substrate is close to the width of the bridge die.

The NCF TCB process is compatible with various different package substrate architectures. In one embodiment, the package substrate may be a standard organic dielectric material, such as a buildup film or the like. Alternatively, the package substrate may comprise a glass substrate, such as a borosilicate glass, a fused silica glass, or the like. In some embodiments, the package substrate may be coreless, or the package substrate may include a core.

Figure 2:
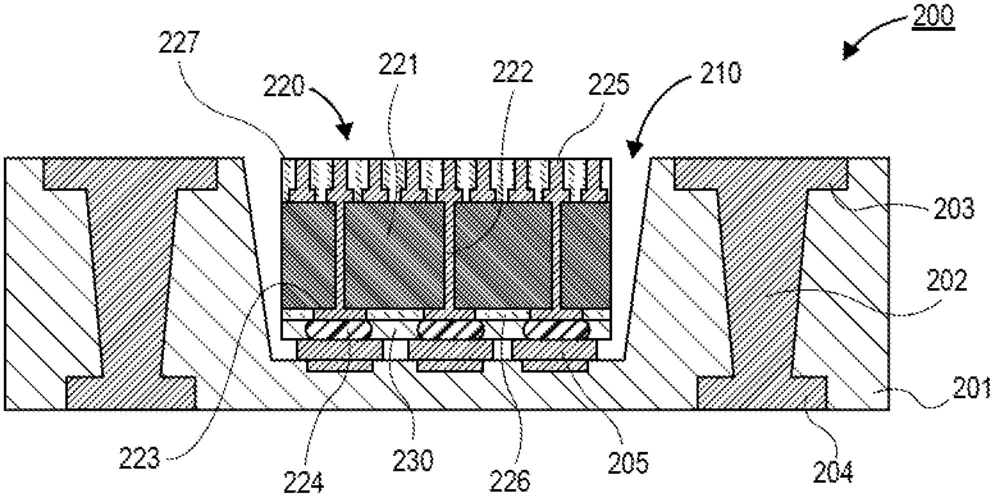
FIG. 2 is a cross-sectional illustration of a package substrate with a cavity for receiving an embedded bridge die, in accordance with an embodiment.

Referring now to FIG. 2, a cross-sectional illustration of an electronic package 200 is shown, in accordance with an embodiment. In an embodiment, the electronic package 200 comprises a package substrate 201. The package substrate 201 may be any material suitable for electronic packaging applications. In some embodiments, the package substrate 201 may be an organic dielectric material, such as a buildup film. In other embodiments, the package substrate 201 may include a glass substrate, such as a borosilicate glass, a fused silica glass, or the like. In the illustrated embodiment, the package substrate 201 is shown as being a coreless package substrate 201. In other embodiments, a core may be provided in the package substrate 201. In the case of an organic dielectric layer for the package substrate 201, the core may be a glass reinforced dielectric, or the core may be substantially all glass.

In an embodiment, conductive features may be provided on and/or in the package substrate 201. For example, first pads 204 may be connected to second pads 203 by vias 202. In the illustrated embodiment, the vias 202 are shown with tapered sidewalls. Though, the sidewalls of the vias 202 may be substantially vertical in some embodiments. Additionally, while the second pads 203 are provided at the top surface of the package substrate 201, in other embodiments, the second pads 203 may be fully embedded within the package substrate 201. Additionally, while not shown, conductive traces and the like may also be embedded in the package substrate.

In an embodiment, the package substrate 201 may include a cavity 210. The cavity 210 may have tapered sidewalls in some embodiments. The tapered sidewalls may be indicative of a laser ablation patterning process used to form the cavity 210. However, when other patterning processes are used (e.g., a chemical etching process), the sidewalls of the cavity 210 may be substantially vertical. In an embodiment, one or more cavity pads 205 may be provided at a bottom of the cavity 210. The cavity pads 205 may be electrically coupled to other conductive features in the package substrate 201.

In an embodiment, a bridge die 220 may be inserted into the cavity 210. The bridge die 220 may have a width that is smaller than a minimum width of the cavity 210. For example, the bridge die 220 may have a width that is smaller than the minimum width of the cavity 210 by approximately 50 μm or more. As used herein, "approximately" may refer to a range of values that are within ten percent of the stated value. For example, approximately 50 μm may refer to a range between 45 μm and 55 μm.

In an embodiment, the bridge die 220 may comprise a substrate 221. The substrate 221 may be a silicon substrate in some embodiments. As shown, vias 222 may pass through a thickness of the substrate 221. In some embodiments, the vias 222 may be referred to as through silicon vias (TSVs). The bottom of the vias 222 may land on pads 223. The pads 223 may be in a dielectric layer 226 below the substrate 221. In an embodiment, solder 224 may couple the pads 223 to the cavity pads 205. In a particular embodiment, the solder 224 may be surrounded by a non-conductive film (NCF) 230. The NCF 230 may be a polymer or an epoxy. The NCF 230 may be cured after the bridge die 220 is coupled to the cavity pads 205 (e.g., with a thermocompression bonding (TCB) process). The NCF 230 may be provided around the solder 224 before the bridge die 220 is bonded to the cavity pads 205. As such, there is no need to dispense or remove a material below the bridge die 220 after bonding to the cavity pads 205.

In an embodiment, conductive features 225 may be provided over a top surface of the bridge die 220. The conductive features 225 may include pads, traces, vias, and the like. In some embodiments, the conductive features 225 include high density routing in order to communicatively couple a pair of dies (not shown) together. In an embodiment, the vias 222 provide an electrical connection from the pads 223 on the backside of the bridge die 220 to the conductive features 225 on the front side of the bridge die 220. The electrical path along the vias 222 may be used to provide a power delivery path through a thickness of the bridge die 220. In an embodiment, the bridge die 220 may be an active bridge die 220 or a passive bridge die 220.

Figure 3:
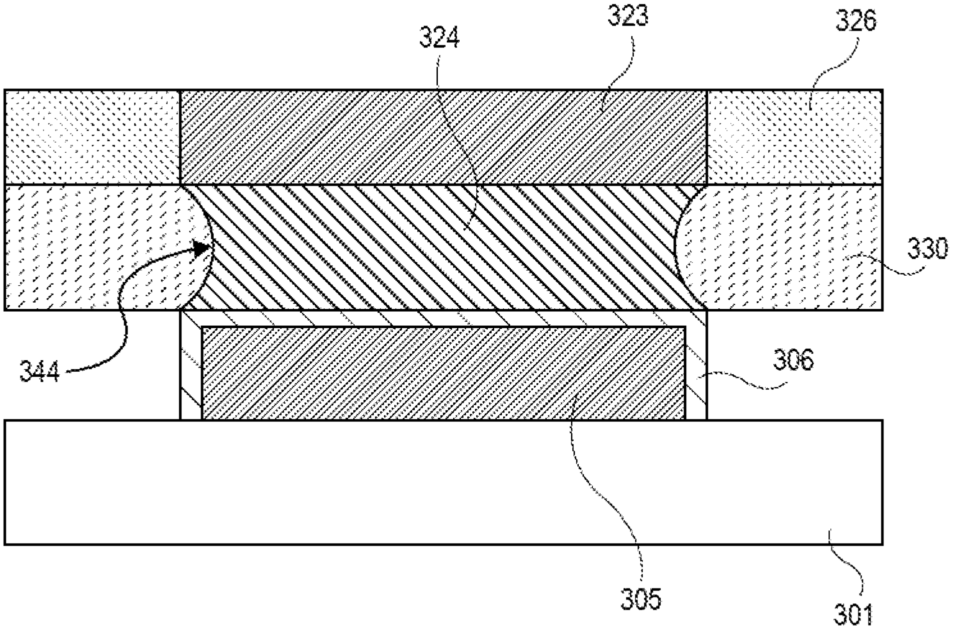
FIG. 3 is a zoomed in illustration showing the solder connection between a package side pad and a backside pad of the bridge die, in accordance with an embodiment.

Referring now to FIG. 3, a zoomed in illustration of an interconnect between the bridge die and the cavity pad 305 is shown, in accordance with an embodiment. As shown, the cavity pad 305 may be provided over the package substrate 301. The cavity pad 305 may be at the bottom of a cavity in the package substrate 301. In a particular embodiment, the cavity pad 305 may include a surface treatment 306. The surface treatment improves the wetting of the solder 324 in order to provide a more reliable bond between the pad 323 and the cavity pad 305. For example, the surface treatment 306 may include a layer of gold or the like.

In an embodiment, the bridge die may include a dielectric layer 326 with a pad 323 in the dielectric layer 326. A semiconductor substrate (not shown) may be provided above the dielectric layer 326. In an embodiment, an NCF 330 may be provided around the solder 324. The NCF 330 may be provided around the solder before the pad 323 is bonded to the cavity pad 305. In an embodiment, the solder 324 ideally fully wets the surface of the cavity pad 305 in order to provide a reliable bond. In some instances, the solder 324 has a concave sidewall 344. Though, in other embodiments, the sidewall 344 may be convex or substantially vertical. After the reflow of the solder 344, the NCF 330 may be cured.

Figure 4:
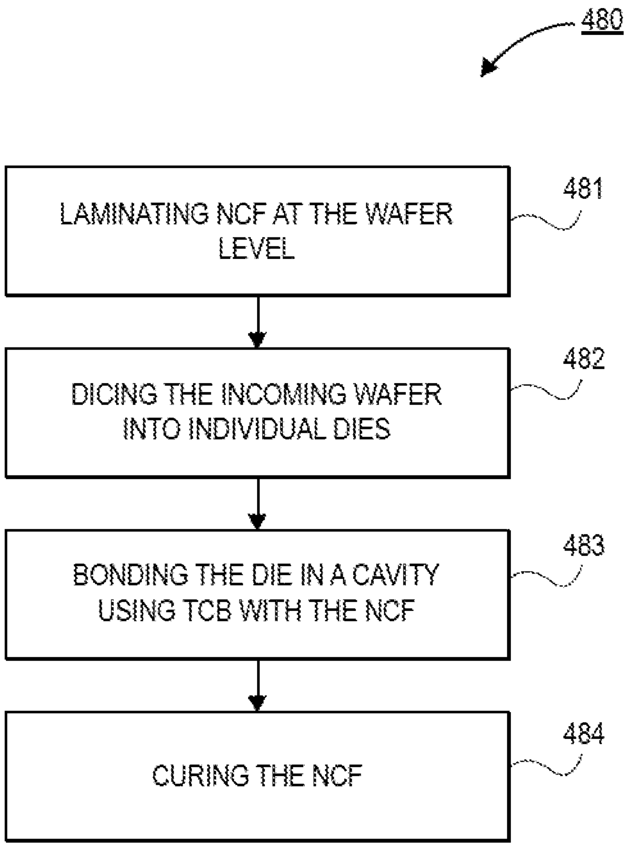
FIG. 4 is a process flow diagram depicting a process for attaching a bridge die to a package substrate with TCB that utilizes a non-conductive film (NCF) instead of flux, in accordance with an embodiment.

Referring now to FIG. 4 a process flow diagram of a process 480 for assembling a bridge die in a cavity of a package substrate is shown, in accordance with an embodiment. In an embodiment, the process 480 may begin with operation 481, which includes laminating an NCF at the wafer level. That is, a single lamination process can be used in order to cover a plurality of bridge dies with the NCF material. The NCF material may include a polymer, an epoxy, or the like. After the NCF layer is formed over the wafer, the process 480 may continue with operation 482. Operation 482 may include dicing the incoming wafer into individual dies. The dicing process may be implemented with any suitable dicing process (e.g., laser ablation, mechanical sawing, and the like). Each of the individual dies may have a NCF layer over underlying solder bumps.

In an embodiment, the process 480 may continue with operation 483, which comprises bonding the die in a cavity using TCB with the NCF. The TCB process may result in the reflow of the solder surrounded by the NCF. Since the NCF is uncured at this point, the solder is free to reflow when raised above the melting temperature of the solder. Additionally, since the solder is surrounded by the NCF, there is no additional need for a flux during the TCB process.

In an embodiment, the process 480 may continue with operation 484, which comprises curing the NCF. The curing process may be implemented at an elevated temperature. After curing, the NCF is converted into a rigid material that provides lateral support to the solder interconnects. As such, there is no further need to apply an underfill material, such as a capillary underfill (CUF) material. In comparison to the process described in FIG. 1, there is no need for flux dipping, flux removal, and CUF dispensing. As such, the process is simplified since fewer processing operations are needed.

Referring now to FIGS. 5A-5H, a series of cross-sectional illustrations depicting the process for forming a package substrate with a bridge die that includes TSVs is shown, in accordance with an embodiment. In an embodiment, the process flow depicted in FIGS. 5A-5H may be similar to the process 480 described in greater detail above.

Figure 5A:
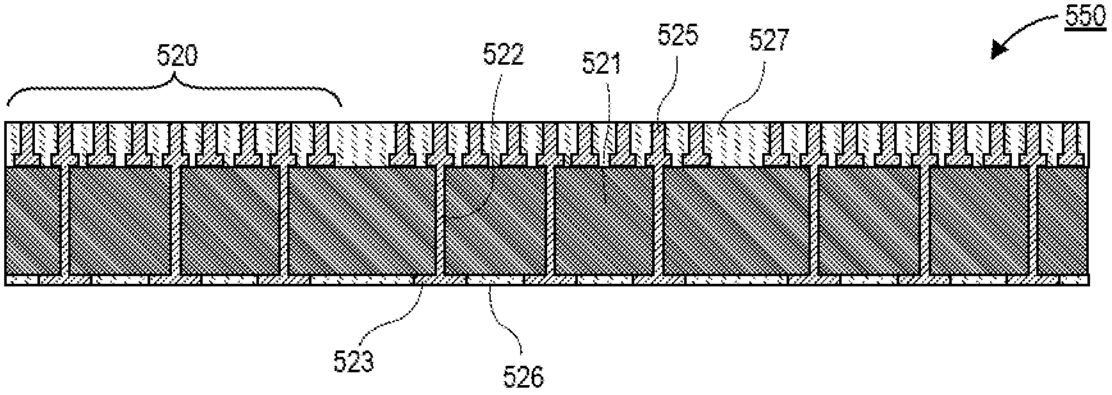
FIG. 5A is a cross-sectional illustration of a wafer with a plurality of bridge dies, in accordance with an embodiment.

Referring now to FIG. 5A, a cross-sectional illustration of a wafer 550 is shown, in accordance with an embodiment. In an embodiment, the wafer 550 may comprise a plurality of bridge dies 520 that are integrated into the single wafer 550. The wafer 550 may include a semiconductor substrate 521. For example, a silicon substrate 521 may be used in the wafer 550. In an embodiment, vias 522 may pass through the substrate 521. The vias 522 may provide electrical coupling between a bottom surface of the wafer 550 and a top surface of the wafer 550. For example, underlying pads 523 in a first dielectric layer 526 may be electrically coupled to conductive features 525 in a second dielectric layer 527. The conductive features 525 may include pads, vias, traces, and the like. The conductive features 525 may be used to electrically couple overlying dies (not shown) together. The conductive features 525 may also couple the vias 522 to the overlying dies (not shown).

In the illustrated embodiment, each bridge die 520 comprises a set of three vias 522. Though, it is to be appreciated that any number of vias 522 may be provided in each bridge die 520. In a particular embodiment, the vias 522 are used to supply power through a thickness of the bridge die 520. As such, the benefit of die tiling is enabled without sacrificing area for power delivery.

Figure 5B:
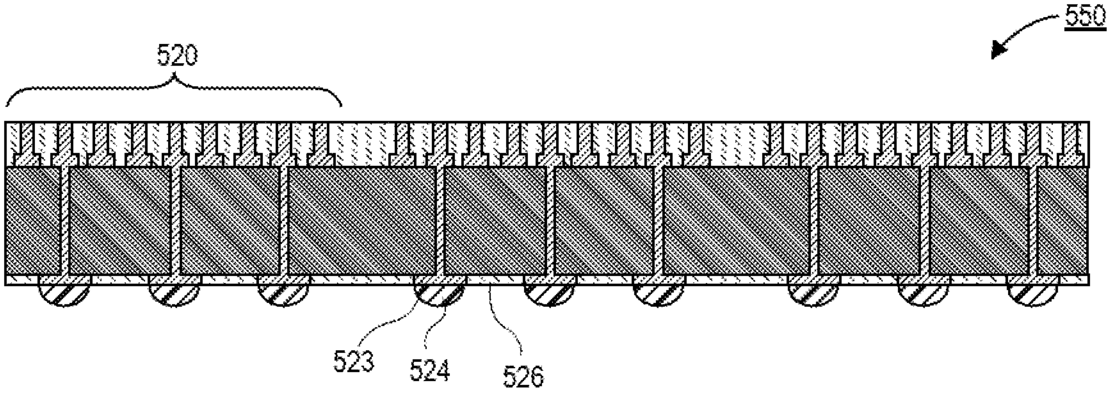
FIG. 5B is a cross-sectional illustration of the wafer after solder is applied to the backside pads of the wafer, in accordance with an embodiment.

Referring now to FIG. 5B, a cross-sectional illustration of the wafer 550 after solder 524 is attached to each of the pads 523 is shown, in accordance with an embodiment. In the illustrated embodiment, the solder 524 is shown as being reflown. However, in some embodiments, the solder 524 may be as plated at this point in the process flow. Any suitable plating process or other deposition process may be used in order to attach the solder 524 to the pads 523. In an embodiment, the solder 524 may include any suitable solder alloy. For example, the solder 524 may be a tin based solder, though other solder compositions are also possible. In the particular embodiment shown in FIG. 5B, the width of the solder 524 is smaller than a width of the pad 523. Though, in other embodiments, the width of the solder 524 may be substantially similar to the width of the pads 523. Further, the bottom surface of the pads 523 may be substantially coplanar with the bottom surface of the dielectric layer 526. In such embodiments, solder 524 may be isolated to only the bottom surface of the pads 523.

Figure 5C:
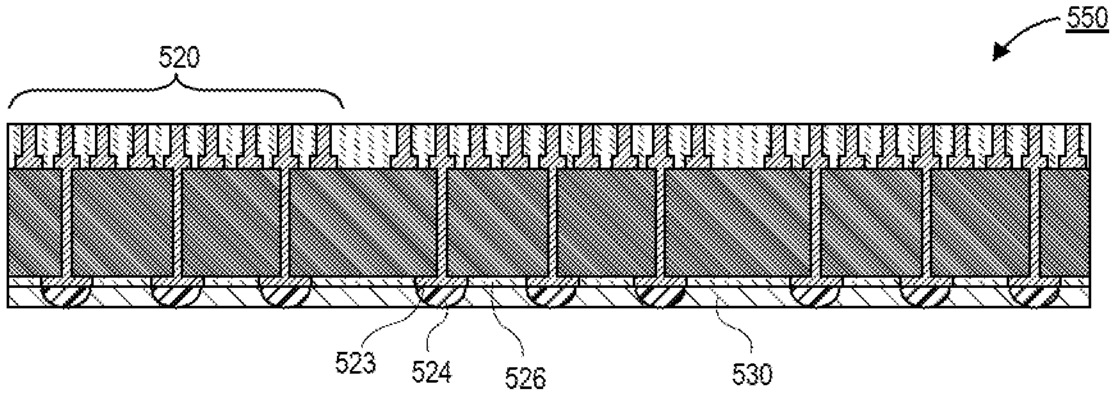
FIG. 5C is a cross-sectional illustration of the wafer after an NCF is applied over the solder and the backside pads of the wafer, in accordance with an embodiment.

Referring now to FIG. 5C, a cross-sectional illustration of the wafer 550 after an NCF 530 is dispensed over the solder 524 is shown, in accordance with an embodiment. In an embodiment, the NCF 530 may be applied with a lamination process or the like. Since the bridge dies 520 are still part of a monolithic wafer 550, only a single lamination process is needed in order to cover the solder 524 of all of the bridge dies 520. In an embodiment, the NCF 530 may be a polymer, an epoxy, or the like. The NCF 530 may be in direct contact with the solder 524. That is, the NCF 530 may conform to the shape of the solder 524. The NCF 530 may also be provided in direct contact with a bottom surface of the bridge dies 520. For example, the NCF 530 may directly contact the dielectric layer 526.

Figure 5D:
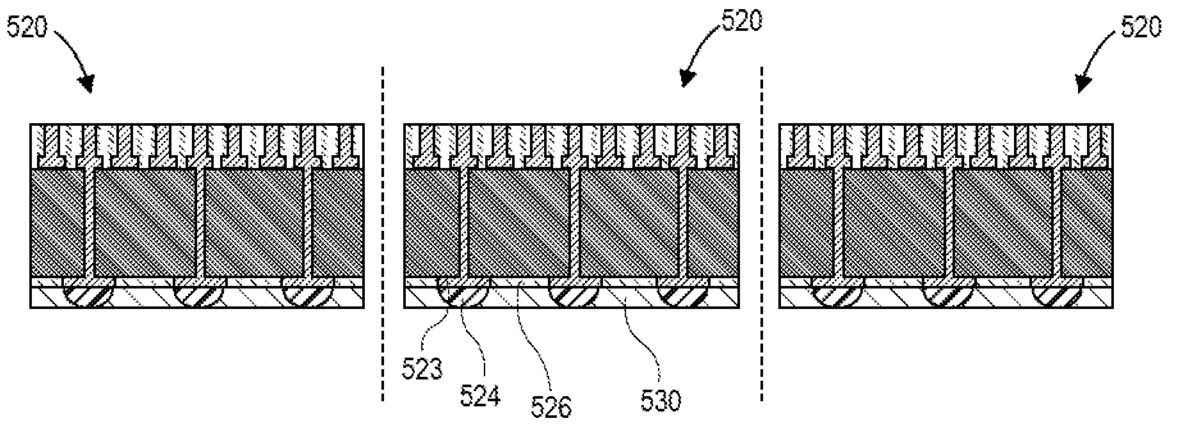
FIG. 5D is a cross-sectional illustration of the wafer after individual bridge dies are singulated from the wafer, in accordance with an embodiment.

Referring now to FIG. 5D, a cross-sectional illustration of the wafer 550 after singulation is shown, in accordance with an embodiment. As shown, each of the bridge dies 520 are mechanically separated from each other along saw streets between the bridge dies 520. In some embodiments, the singulation process includes a laser ablation process, a mechanical sawing process, combinations thereof, or any other dicing process. In the illustrated embodiment, the sidewalls of the bridge dies 520 are shown as being substantially vertical. Though is some embodiments, sidewalls of the bridge dies 520 may be tapered, depending on the dicing process used.

Figure 5E:
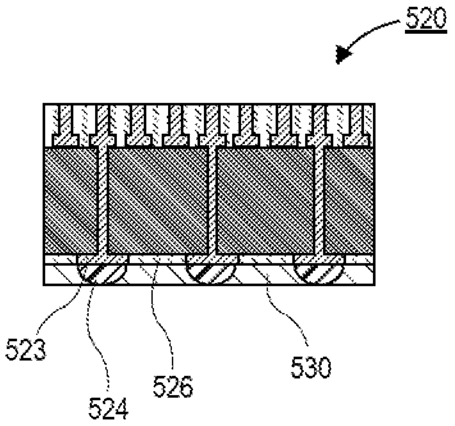
FIG. 5E is a cross-sectional illustration of a single bridge die, in accordance with an embodiment.

Referring now to FIG. 5E, a cross-sectional illustration of a single bridge die 520 is shown, in accordance with an embodiment. The single bridge die 520 may be used in subsequent processing operations in order to form a package substrate 500, as will be described in greater detail below. The bridge die 520 may comprise pads 523 that sit in a dielectric layer 526. Solder 524 may be provided over the pads 523, and the solder 524 may be surrounded by the NCF 530.

Figure 5F:
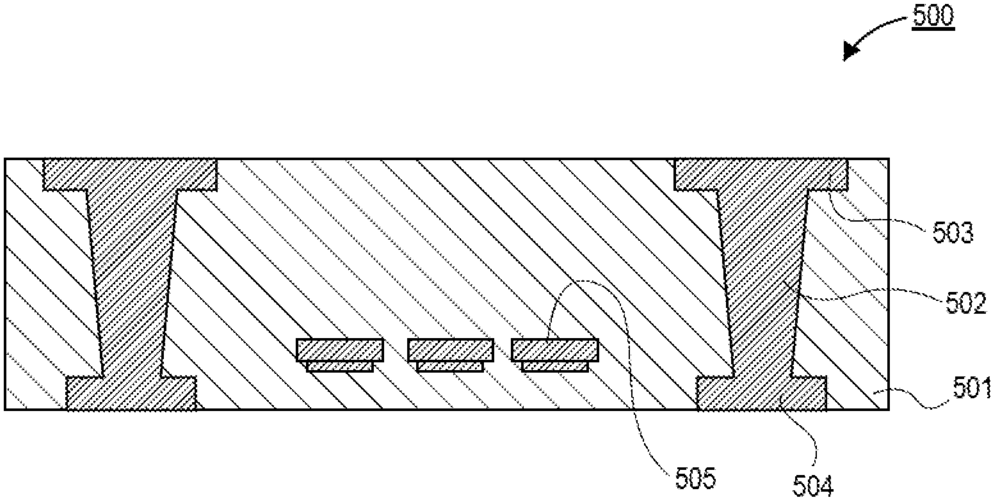
FIG. 5F is a cross-sectional illustration of an electronic package, in accordance with an embodiment.

Referring now to FIG. 5F, a cross-sectional illustration of an electronic package 500 at a stage of manufacture is shown, in accordance with an embodiment. In an embodiment, the electronic package 500 comprises a package substrate 501. The package substrate 501 may be an organic dielectric material, glass, or the like. In an embodiment, the package substrate 501 may include conductive features in order to provide electrical routing within the package substrate 501. For example, embodiments may include first pads 504 and second pads 503. Vias 502 may electrically couple the first pads 504 to the second pads 503. Additionally, conductive traces (not shown) may be used in order to provide horizontal conductive routing in the package substrate 501.

In an embodiment, cavity pads 505 may be embedded within the package substrate 501. The cavity pads 505 may be provided in an area of the package substrate 501 where a cavity will subsequently be formed. In a particular embodiment, the cavity pads 505 may be used as power delivery pads. That is, the cavity pads 505 may be electrically coupled to a power source. The power may then be supplied to a bridge die (not shown) in order to power overlying dies (not shown).

Figure 5G:
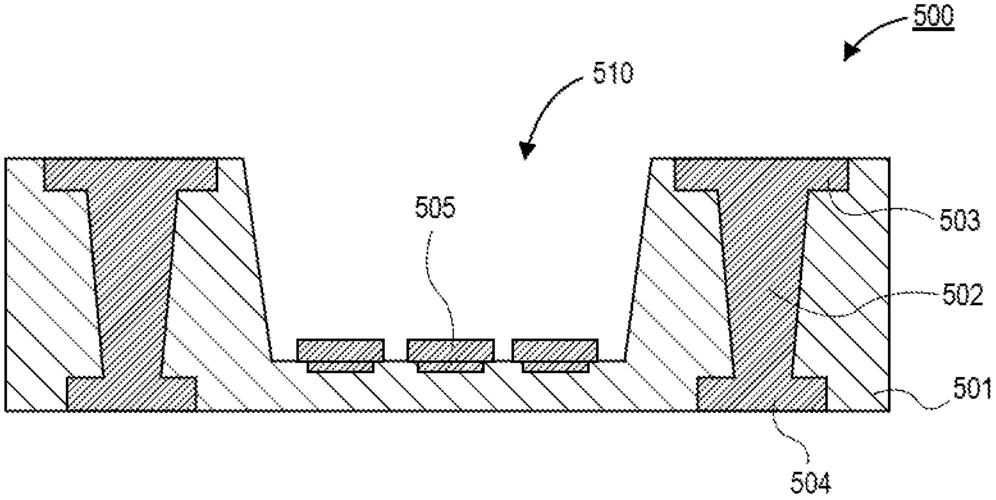
FIG. 5G is a cross-sectional illustration of the electronic package after a cavity is formed into the package substrate, in accordance with an embodiment.

Referring now to FIG. 5G, a cross-sectional illustration of the electronic package 500 after a cavity 510 is formed into the package substrate 500 is shown, in accordance with an embodiment. In an embodiment, the cavity 510 may be formed with any suitable process. For example, an etching process may be used in some embodiments. In other embodiments, a laser ablation process may be used to form the cavity 510. The profile of the sidewalls of the cavity 510 may be dependent on the fabrication method used. In the illustrated embodiment, the cavity 510 has sloped sidewalls. Though, in other embodiments, the sidewalls of the cavity 510 may be substantially vertical. In an embodiment, a depth of the cavity 510 may be suitable for exposing the cavity pads 505. In an embodiment, the entire thickness of the cavity pads 505 are exposed above the surface of the package substrate 501. In other embodiments, the sidewalls or a portion of the sidewalls of the cavity pads 505 may be covered by the package substrate 501.

In the illustrated embodiment, the cavity pads 505 are shown without any surface finish. However, in some embodiments, a surface finish (e.g., a layer of gold) may be applied over the cavity pads 505. The surface finish may be applied to the cavity pads 505 before the package substrate 501 is disposed over the cavity pads 505. In other embodiments, the surface finish may be applied to the cavity pads 505 after the cavity 510 is formed.

Figure 5H:
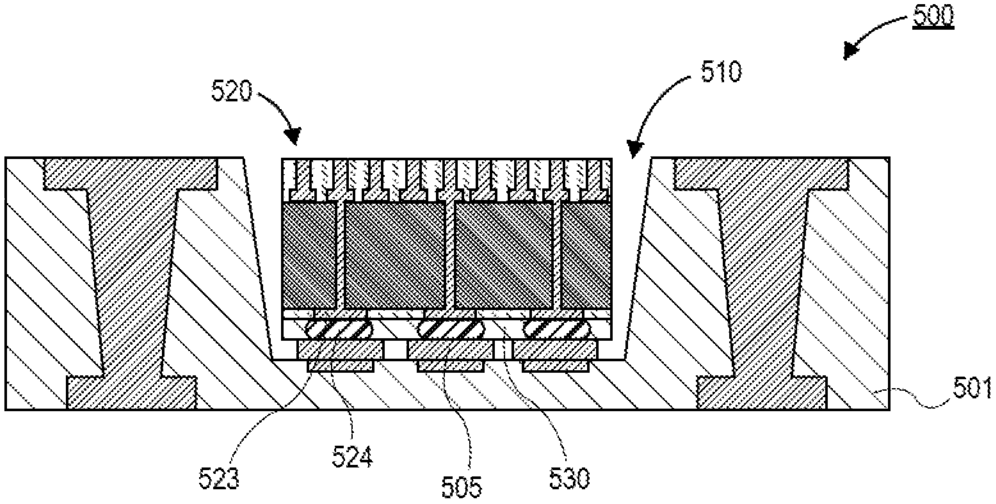
FIG. 5H is a cross-sectional illustration of the electronic package after the bridge die is embedded in the cavity, in accordance with an embodiment.

Referring now to FIG. 5H, a cross-sectional illustration of the electronic package 500 after a bridge die 520 is inserted into the cavity 510 in the package substrate 501 is shown, in accordance with an embodiment. In an embodiment, the bridge die 520 may be substantially similar to the bridge die 520 shown in FIG. 5E. A width of the bridge die 520 may be smaller than a minimum width of the cavity 510. For example, the width of the bridge die 520 may be between approximately 25 μm and approximately 100 μm smaller than the minimum width of the cavity 510.

In an embodiment, the bridge die 520 may be mounted to the cavity pads 505 using a TCB process. During the TCB process, the solder 524 may be reflown and form an electrical connection between the pads 523 and the underlying cavity pads 505. At the time of the TCB process, the NCF 530 may be uncured. As such, the solder 524 may be free to reflow in order to wet the cavity pads 505. While shown as partially wetting the cavity pads 505, in some embodiments the solder 524 may completely wet the top surfaces of the cavity pads 505, similar to the embodiment shown in FIG. 3. Since the NCF 530 surrounds the solder 524, there is no need for an additional fluxing agent. As such, a flux removal step is omitted from the process flow.

Additionally, the NCF 530 can perform the function of an underfill. Particularly, the NCF 530 can be cured after the TCB process. The cured NCF 530 may have a mechanical rigidity that performs the function of an underfill in order to provide robust interconnects between the bridge die 520 and the cavity pads 505. Any suitable curing process duration and temperature may be used to cure the NCF 530. Since the NCF 530 is present during the TCB process, there is no further need to dispense an underfill which is otherwise made difficult due to the small gap between the sidewall of the bridge die 520 and the sidewall of the cavity 510.

Figure 6:
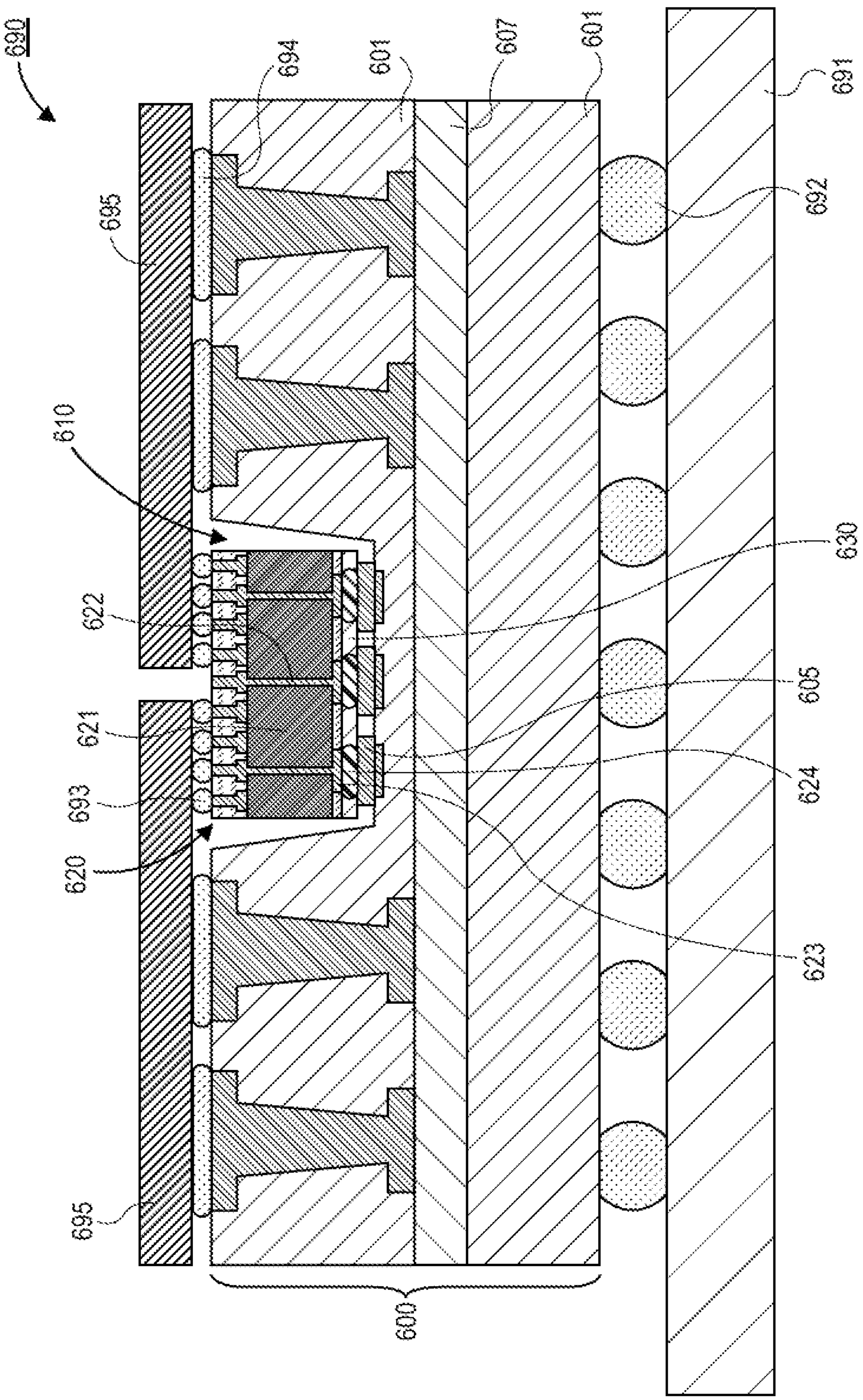
FIG. 6 is a cross-sectional illustration of an electronic system with a bridge that includes an NCF around the solder for coupling together a pair of overlying dies, in accordance with an embodiment.

Referring now to FIG. 6, a cross-sectional illustration of an electronic system 690 is shown, in accordance with an embodiment. In an embodiment, the electronic system 690 may comprise a board 691, such as a printed circuit board (PCB). The board 691 may be coupled to an electronic package 600 using interconnects 692. While interconnects 692 are shown as solder balls, it is to be appreciated that any interconnect architecture may couple the board 691 to the electronic package 600.

In an embodiment, the electronic package 600 may include a core 607. Package substrate layers 601 may be provided above and below the core 607. In some embodiments, the core 607 may be omitted. In an embodiment, a cavity 610 is formed into a surface of the package substrate 601. Cavity pads 605 may be provided at the bottom of the cavity 610. In an embodiment, a bridge die 620 is inserted into the cavity 610. The bridge die 620 may comprise a semiconductor substrate 621 and vias 622. The bottom of the vias 622 may be coupled to pads 623. The pads 623 may be electrically coupled to the cavity pads 605 by solder 624. The solder 624 may be surrounded by an NCF 630.

In an embodiment, the bridge die 620 may be coupled to overlying dies 695 by interconnects 693. For example, the bridge die 620 may electrically couple a first die 695 to a second die 695. The vias 622 may provide power through the bridge die 620 to the overlying dies 695. The dies 695 may also be electrically coupled to the package substrate 601 through interconnects 694. The interconnects 693 and 694 may be any first level interconnect (FLI) architecture.

Figure 7:
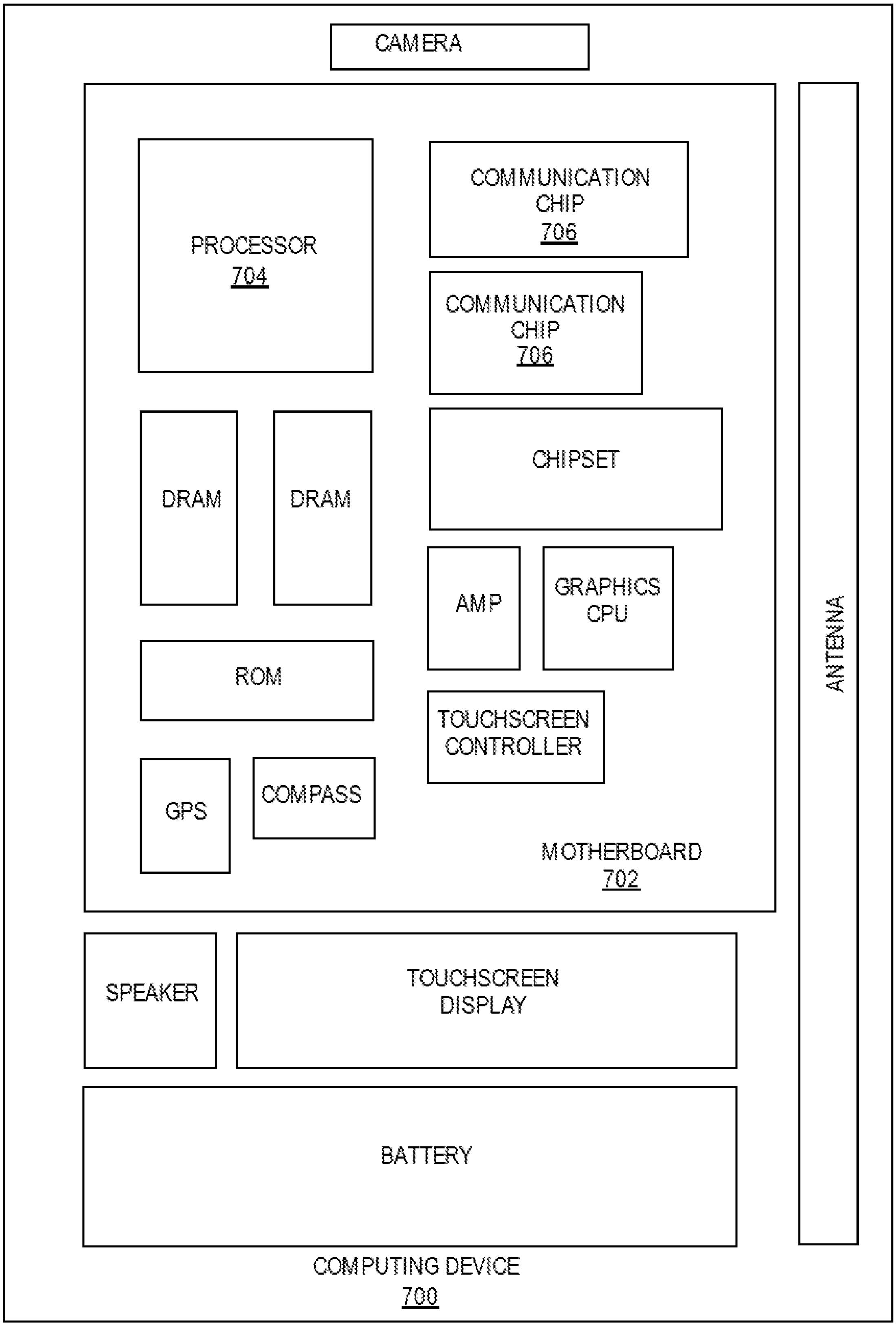
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of an electronic package that comprises a bridge die with TSVs and an NCF around solder interconnects, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of an electronic package that comprises a bridge die with TSVs and an NCF around solder interconnects, in accordance with embodiments described herein.

In an embodiment, the computing device 700 may be part of any apparatus. For example, the computing device may be part of a personal computer, a server, a mobile device, a tablet, an automobile, or the like. That is, the computing device 700 is not limited to being used for any particular type of system, and the computing device 700 may be included in any apparatus that may benefit from computing functionality.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; an opening in the package substrate, wherein a plurality of first pads are provided at a bottom of the opening; a bridge die in the opening, wherein the bridge die comprises a plurality of second pads that are coupled to the first pads by solder; and a non-conductive film (NCF) around the solder between the first pads and the second pads.

Example 2: the electronic package of Example 1, wherein a plurality of vias pass through the bridge die.

Example 3: the electronic package of Example 1 or Example 2, wherein the package substrate comprises an organic material.

Example 4: the electronic package of Example 1 or Example 2, wherein the package substrate comprises glass.

Example 5: the electronic package of Examples 1-4, wherein the NCF comprises an epoxy.

Example 6: the electronic package of Examples 1-5, wherein the first pads include a surface finish.

Example 7: the electronic package of Example 6, wherein the surface finish comprises gold.

Example 8: the electronic package of Examples 1-7, wherein the bridge die is a passive bridge die.

Example 9: the electronic package of Examples 1-8, wherein the bridge die is an active bridge die.

Example 10: the electronic package of Examples 1-9, further comprising a first die coupled to a second die by the bridge die.

Example 11: a bridge die, comprising: a die substrate; a plurality of vias through the die substrate; a plurality of pads over a backside of the plurality of vias; a plurality of solder bumps on the plurality of pads; and a non-conductive film (NCF) over the plurality of solder bumps.

Example 12: the bridge die of Example 11, wherein the NCF comprises an epoxy.

Example 13: the bridge die of Example 11 or Example 12, wherein the solder bumps are substantially embedded in the NCF.

Example 14: the bridge die of Examples 11-13, wherein the die substrate is an active silicon die.

Example 15: the bridge die of Examples 11-14, wherein the die substrate is a passive silicon die.

Example 16: an electronic system, comprising: a board; a package substrate coupled to the board, wherein the package substrate comprises: a cavity; a bridge die in the cavity, wherein a backside of the bridge die is coupled to pads in the cavity using a non-conductive film (NCF) around solder between the bridge die and the pads; a first die coupled to the package substrate; and a second die coupled to the package substrate, wherein the first die is communicatively coupled to the second die by the bridge die.

Example 17: the electronic system of Example 16, wherein the bridge die is an active bridge or a passive bridge.

Example 18: the electronic system of Example 16 or Example 17, wherein the NCF comprises an epoxy.

Example 19: the electronic system of Examples 16-18, wherein the pads comprise a surface finish.

Example 20: the electronic system of Examples 16-19, wherein the electronic system is part of a personal computer, a server, a mobile device, a tablet, or an automobile.

What is claimed is:

1. An electronic package, comprising:

a package substrate;

an opening in the package substrate, the opening having sloped sidewalls, wherein a plurality of first pads are provided at a bottom of the opening;

a bridge die in the opening, wherein the bridge die comprises a plurality of second pads that are coupled to the first pads by solder; and a non-conductive film (NCF) around the solder between the first pads and the second pads.

2. The electronic package of claim 1, wherein a plurality of vias pass through the bridge die.

3. The electronic package of claim 1, wherein the package substrate comprises an organic material.

4. The electronic package of claim 1, wherein the package substrate comprises glass.

5. The electronic package of claim 1, wherein the NCF comprises an epoxy.

6. The electronic package of claim 1, wherein the first pads include a surface finish.

7. The electronic package of claim 6, wherein the surface finish comprises gold.

8. The electronic package of claim 1, wherein the bridge die is a passive bridge die.

9. The electronic package of claim 1, wherein the bridge die is an active bridge die.

10. The electronic package of claim 1, further comprising a first die coupled to a second die by the bridge die.

11. A bridge die, comprising:
- a die substrate;
- a plurality of vias through the die substrate;
- a first plurality of pads over a backside of the plurality of vias;
- a second plurality of pads over a front side of the plurality of vias, individual ones of the second plurality of pads having a width less than a width of individual ones of the first plurality of pads;
- a plurality of solder bumps on the first plurality of pads; and
- a non-conductive film (NCF) over the plurality of solder bumps.

12. The bridge die of claim 11, wherein the NCF comprises an epoxy.

13. The bridge die of claim 11, wherein the solder bumps are substantially embedded in the NCF.

14. The bridge die of claim 11, wherein the die substrate is an active silicon die.

15. The bridge die of claim 11, wherein the die substrate is a passive silicon die.

16. An electronic system, comprising:
- a board;
- a package substrate coupled to the board, wherein the package substrate comprises:
  - a cavity, the cavity having sloped sidewalls;
  - a bridge die in the cavity, wherein a backside of the bridge die is coupled to pads in the cavity using a non-conductive film (NCF) around solder between the bridge die and the pads;
- a first die coupled to the package substrate; and
- a second die coupled to the package substrate, wherein the first die is communicatively coupled to the second die by the bridge die.

17. The electronic system of claim 16, wherein the bridge die is an active bridge or a passive bridge.

18. The electronic system of claim 16, wherein the NCF comprises an epoxy.

19. The electronic system of claim 16, wherein the pads comprise a surface finish.

20. The electronic system of claim 16, wherein the electronic system is part of a personal computer, a server, a mobile device, a tablet, or an automobile.

* * * * *